United States Patent
Schmitt et al.

(10) Patent No.: US 6,596,085 B1
(45) Date of Patent: Jul. 22, 2003

(54) METHODS AND APPARATUS FOR IMPROVED VAPORIZATION OF DEPOSITION MATERIAL IN A SUBSTRATE PROCESSING SYSTEM

(75) Inventors: John Vincent Schmitt, Sunnyvale, CA (US); Shih-Hung Li, Mountain View, CA (US); Christophe Marcadal, Santa Clara, CA (US); Anzhong Chang, San Jose, CA (US); Ling Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/495,551

(22) Filed: Feb. 1, 2000

(51) Int. Cl.⁷ .............................................. C23C 16/44
(52) U.S. Cl. ....................................... 118/726; 261/141
(58) Field of Search ................................. 261/141, 142; 118/726

(56) References Cited

U.S. PATENT DOCUMENTS

| | | | |
|---|---|---|---|
| 4,558,845 A | | 12/1985 | Hunkapiller |
| 5,203,925 A | | 4/1993 | Shibuya et al. |
| 5,376,409 A | | 12/1994 | Kaloyeros et al. |
| 5,419,924 A | * | 5/1995 | Nagashima et al. ...... 427/248.1 |
| 5,505,781 A | * | 4/1996 | Omori et al. ................ 118/726 |
| 5,766,342 A | * | 6/1998 | Shibuya et al. ............... 117/54 |
| 5,972,117 A | | 10/1999 | Schmitt |
| 6,006,701 A | * | 12/1999 | Nagano .................... 122/367.1 |
| 6,022,416 A | * | 2/2000 | Olson .......................... 118/726 |
| 6,036,783 A | * | 3/2000 | Fukunaga et al. ............ 118/724 |
| 6,082,714 A | * | 7/2000 | Dornfest et al. ............. 261/142 |
| 6,210,485 B1 | * | 4/2001 | Zhao et al. .................. 118/724 |

FOREIGN PATENT DOCUMENTS

| | | | |
|---|---|---|---|
| EP | 533201 A | * | 9/1992 |
| EP | 0799907 | | 10/1997 |
| EP | 0878560 | | 11/1998 |
| GB | 2345298 | | 7/2000 |
| JP | 3008330 | | 1/1991 |
| JP | 7273052 | | 10/1995 |

OTHER PUBLICATIONS

US 5,976,262, 11/1999, Sivaramakrishnan et al. (withdrawn)
U.S. patent application Ser. No. 09/120,004 (Docket 2460).
WD–40 Aerosol–type dispenser with straw extension received in nozzle of dispense, as described in web pages entitled "WD–40 Material Safety Data Sheet" dated 1998 and "Hold–it—the Tubular Straw Holder," dated 1997.
EP 01102105.2 Search Report mailed May 28, 2001.
U.S. patent application Ser. No. 09/352,629 (Docket 2847).

* cited by examiner

Primary Examiner—Gregory Mills
Assistant Examiner—Sylvia R. MacArthur
(74) Attorney, Agent, or Firm—Konrad Raynes Victor & Mann, LLP

(57) ABSTRACT

A deposition system for performing chemical vapor deposition comprising deposition chamber and a vaporizer coupled to said chamber. In one aspect, the vaporizer has a relatively short mixing passageway to mix a carrier gas with a liquid precursor to produce a fine aerosol-like dispersion of liquid precursor which is vaporized by a hot plate.

6 Claims, 5 Drawing Sheets

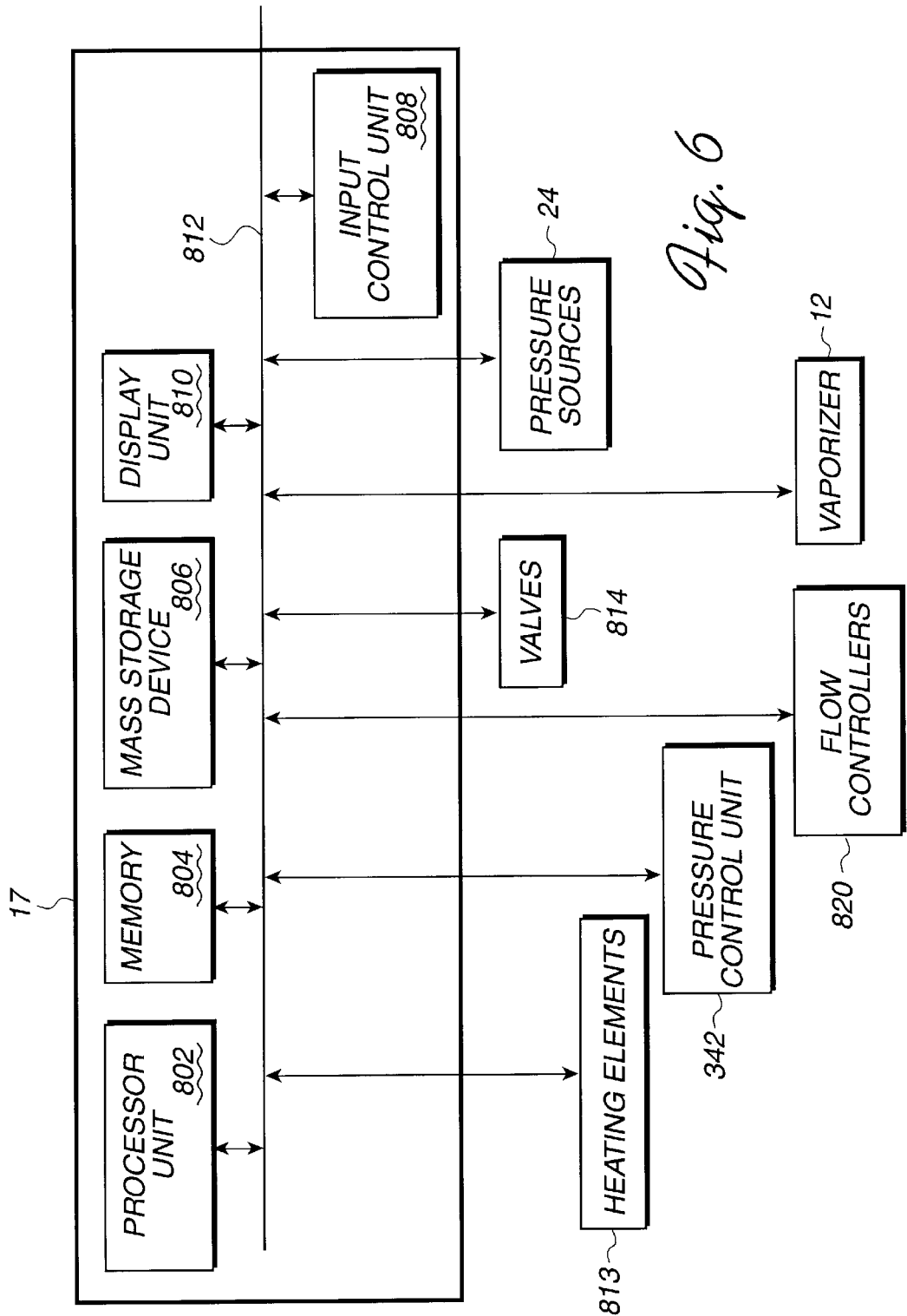

METHODS AND APPARATUS FOR IMPROVED VAPORIZATION OF DEPOSITION MATERIAL IN A SUBSTRATE PROCESSING SYSTEM

BACKGROUND OF THE DISCLOSURE

1. Field of the Invention

The present inventions are directed toward the field of manufacturing integrated circuits. The inventions are more particularly directed toward improved methods and apparatus for vaporization of deposition material in a deposition process system.

2. Description of the Related Art

Presently, aluminum is widely employed in integrated circuits as an interconnect, such as plugs and vias. However, higher device densities, faster operating frequencies, and larger die sizes have created a need for a metal with lower resistivity than aluminum to be used in interconnect structures. The lower resistivity of copper makes it an attractive candidate for replacing aluminum. There are well established techniques for depositing copper, including electroplating, chemical vapor deposition ("CVD") and physical vapor deposition ("PVD"). A CVD process is desirable because it can often provide for a more conformally deposited layer. For example, chemical vapor deposition of copper may be achieved by using a liquid copper compound precursor known as Cupraselect®, which has the formula Cu(hfac)L. Cupraselect® is a registered trademark of Schumacher of Carlsbad, Calif. The Cupraselect® consists of copper (Cu) bonded to a deposition controlling compound such as (hfac) and a thermal stabilizing compound (L). The (hfac) represents hexafluoroacetylacetonato, and (L) represents a ligand base compound, such as trimethylvinylsilane ("TMVS").

During the CVD of copper using Cu(hfac)L, the precursor is vaporized and flowed into a deposition chamber containing a wafer. In the chamber, the precursor is infused with thermal energy at the wafer's surface. At the desired temperature the following reaction is believed to result:

$$2\ Cu(hfac)L \rightarrow Cu + Cu(hfac)_2 + 2L \qquad (Eqn.\ 1)$$

The resulting copper (Cu) deposits on the upper surface of the wafer. The byproducts of the reaction (i.e., Cu(hfac)$_2$ and (2L) can be purged from the chamber which is typically maintained at a vacuum during wafer processing.

One problem associated with using Cupraselect® for CVD can occur in the delivery of the material from its liquid storage ampoule to the process chamber in which the CVD occurs. Typically, the liquid Cupraselect® is first vaporized and mixed with a carrier gas such as Argon, Helium or another gas (usually an inert gas) between the ampoule and the process chamber. Vaporizers are incorporated into the delivery system and typically operate by altering one of two environmental conditions (temperature or pressure). Many vaporizers raise the temperature of the precursor to establish the desired state change. Unfortunately, raising the temperature too high can cause breakdown of the precursor and subsequent plating (deposition) in transfer lines between the ampoule and process chamber. One example of a known vaporizer is a CEM vaporizer manufactured by Bronkhurst of the Netherlands used to vaporize the precursor liquid. Unfortunately, these devices can clog after vaporizing only about 50–1500 g of Cupraselect®. Such clogs can alter the deposition rate. For many wafer manufacturing applications, the vaporization rate is preferably repeatable from wafer to wafer.

After vaporization, Cupraselect® is often pumped into the process chamber along with an appropriate carrier gas. This pumping action can pull a high concentration of TMVS out of the Cupraselect leaving the less stable copper and (hfac) in the transfer lines between the ampoule, delivery system and process chamber. Under these conditions, undesirable plating or deposition is also likely to occur at various locations. For example, plating can occur near the vaporizer, valves, process chamber showerhead orifices and the like. Plating can change the dimensions of these system components which can degrade performance of the chamber and the resultant deposition layer. Additionally, unwanted plating may flake off during the deposition process which can render a processed wafer faulty or unusable. A maintenance cycle run on the process chamber to replace or clean the chamber can reduce wafer throughput.

As described in copending application Ser. No. 09/120,004, filed Jul. 21, 1998 and assigned to the assignee of the present application and incorporated herein by reference, to provide for repeatable deposition conditions, it is often desirable to create the precursor vapor as close to the process chamber as possible to reduce the likelihood of deposition at points in the delivery system, and to reduce the time and cost of purging the process chamber. In the apparatus of this copending application, a vaporizer is disposed directly on the lid of the process chamber which reduces the components used to deliver the precursor so as to reduce opportunities for clogging and to facilitate purging of the system when so needed.

BRIEF SUMMARY OF AN EMBODIMENT OF THE INVENTIONS

In one aspect of the present inventions, improved methods and apparatus for vaporization of deposition material in a deposition process system are provided. For example, in the illustrated embodiment, a vaporizer includes a body defining a cavity having an outlet and a recessed inlet wherein the cavity outlet is larger than the recessed cavity inlet. The vaporizer body further defines a first passageway coupled to the inlet and adapted to carry a mixed flow of carrier gas and a liquid precursor to the cavity inlet. The passageway has a relatively short length and small width to form small particles of the liquid precursor and to inhibit recombination of the liquid precursor to larger droplets. The cavity is shaped to permit the mixed flow of carrier gas and liquid precursor to expand as it flows from the cavity inlet to the cavity outlet. As a consequence, the liquid precursor is dispersed by the carrier gas expanding through the cavity.

In the example of the illustrated embodiment, the vaporizer is disposed on the lid of a chemical vapor deposition chamber. In another aspect, the vaporizer further includes a hot plate disposed between a showerhead and the cavity outlet, and adapted to vaporize dispersed liquid precursor into vaporized material. The showerhead, disposed in the chamber lid in the illustrated embodiment, is adapted to distribute vaporized material for deposition onto a wafer or other workpiece.

In one aspect of the illustrated embodiment, clogging of the vaporizer may be reduced to increase throughput of the deposition system before purging or other cleaning may be indicated.

It should be understood that the preceding is merely a brief summary of one embodiment of the present inventions and that numerous changes to the disclosed embodiments can be made in accordance with the disclosure herein without departing from the spirit or scope of the inventions.

The preceding summary, therefore is not meant to limit the scope of the inventions. Rather, the scope of the inventions are to be determined only by the appended claims and their equivalents.

BRIEF DESCRIPTION OF THE DRAWINGS

In the drawings illustrating an embodiment of the present inventions:

FIG. 6 illustrates a schematic of a control system for operating the deposition system.

To facilitate understanding, identical reference numerals have been used, where possible, to designate identical elements that are common to the figures.

DETAILED DESCRIPTION

Features of the illustrated embodiment of the present inventions include improved vaporization of a precursor material (e.g., Cupraselect® for copper CVD) for delivery to a deposition system. Although the illustrated embodiments of the inventions are described in terms of copper thin films grown by CVD, those skilled in the art will recognize that the inventions may be applied to any thin film deposition process where it is desirable to maintain controlled and repeatable delivery of process material to improve the resultant film and reduce contamination levels in the system. Other liquid precursors or reactants include but are not limited to TEOS, trimethyl borate, tetraethyl borate, tetraethyl phosphate, tetraethyl phosphite, tetrakis (dimethylamino)titanium diethyl analog, and water. Copper compound precursors other than Cupraselect® may also be used.

Figure 1:
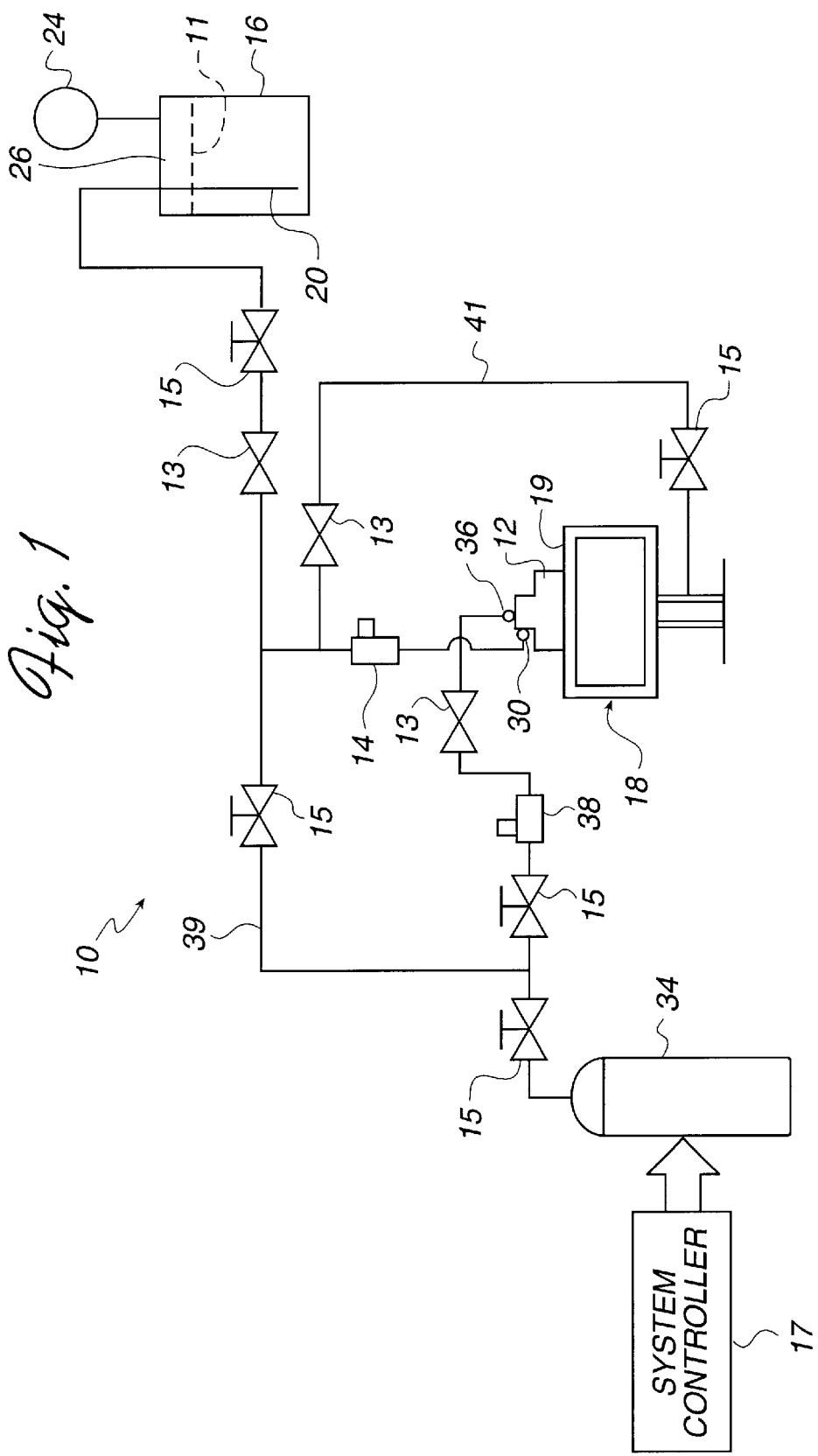
FIG. 1 illustrates a schematic of a CVD copper deposition system in accordance with an embodiment of the present inventions.

Turning now to the drawings, more particularly to FIG. 1, there is shown a liquid delivery system 10 which uses a vaporizer 12 for vaporizing the reactant liqid in a manner which reduces clogging of the vaporizer. Liquid flow rate is controlled by a closed loop system between a liquid flow controller 14 and a system controller 17 which includes a programmed workstation. In the system 10, a liquid reactant 11, such as Cupraselect® is delivered from a liquid bulk delivery tank 16 to a CVD process chamber 18 of a thermal or plasma-enhanced type. The chamber 18 may be conventional except that the vaporizer 12 is preferably mounted directly to the lid 19 of the chamber 18 as described in greater detail below. Examples of suitable chambers include (apart from the aforementioned lid modification) the chambers described in the following commonly owned issued U.S. Pat. No. 5,000,113, issued Mar. 19, 1991 to Adamik et al.; U.S. Pat. No. 4,668,365, issued May 26, 1987 to Foster et al.; U.S. Pat. No. 4,579,080, issued Apr. 1, 1986 to Benzing et al.; U.S. Pat. No. 4,496,609, issued Jan. 29, 1985 to Benzing et al. and U.S. Pat. No. 4,232,063, issued Nov. 4, 1980 to East et al., the disclosures of which are incorporated by reference herein.

The liquid bulk delivery tank 16 has a dip tube 20 extending into the tank 16 and a source 24 providing a pressurized gas such as helium to "head" space 26 at the top of tank 16, above the liquid reactant 11, for driving the liquid from the tank. The liquid flow controller 14 is connected between the liquid bulk delivery tank 16 and liquid inlet 30 of the vaporizer 12. A controlled amount of liquid is received by the vaporizer 12, which converts the liquid to vapor and transports the vapor through the lid 19 of the process chamber 18 by means of a carrier gas, such as helium, nitrogen or argon. A gas tank 34 containing the carrier gas is connected to gas inlet 36 of the vaporizer 12 through a mass flow controller 38 which regulates the gas flow rate. In many applications, liquid 11 may be toxic and/or caustic. To facilitate servicing of the system 10 and its component valves and other elements, a purge line 39 is connected between the gas tank 34 and the liquid flow monitor to allow the operator to purge system 10 of the reactant liquid 11 and its vapor before servicing. To further reduce the amount of reactant in the system, a vacuum line 41 is used in conjunction with purge line 39 to evacuate liquid and vapor from the system. (Vacuum line 41 is coupled to the vacuum system of the CVD process chamber.) Remotely controllable (e.g., pneumatic) valves 13 are inserted on each line. These valves are opened and closed to enable normal operation and purge and evacuation operations. To enhance safety and fault-tolerance, each line having a remotely controlled valve 13 may also have a manual valve 15 which can be closed manually if the remotely controlled valve fails.

Figure 2:
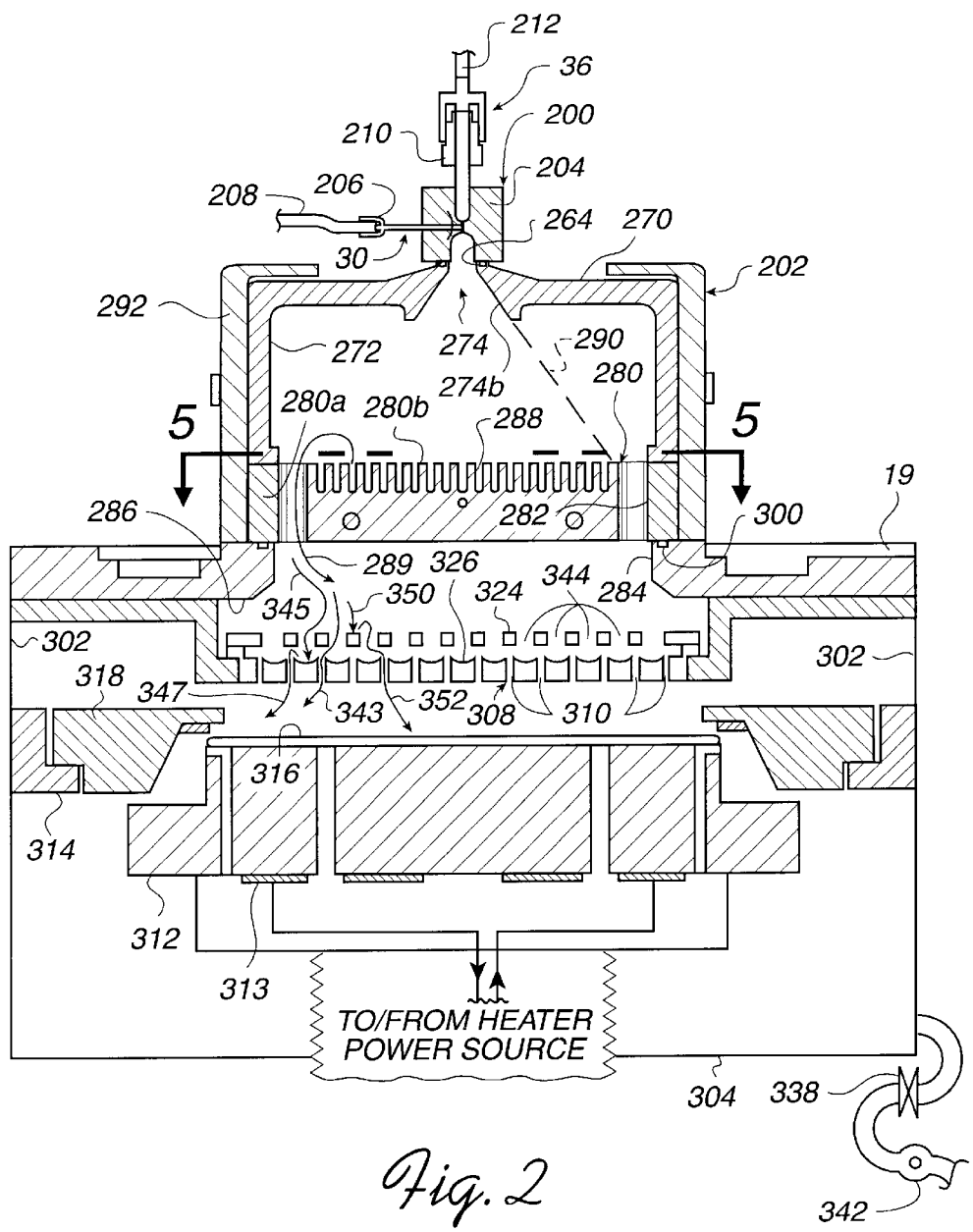
FIG. 2 illustrates a cross-sectional view of the vaporizer and CVD chamber of FIG. 1.
Figure 4:
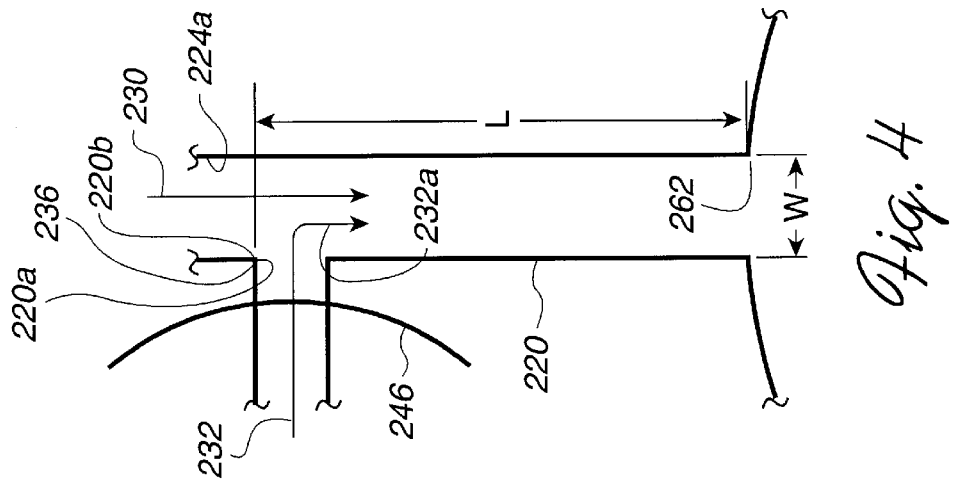
FIG. 4 illustrates an enlarged cross-sectional view of a passageway and cavity inlet of the vaporizer of FIG. 3.
Figure 3:
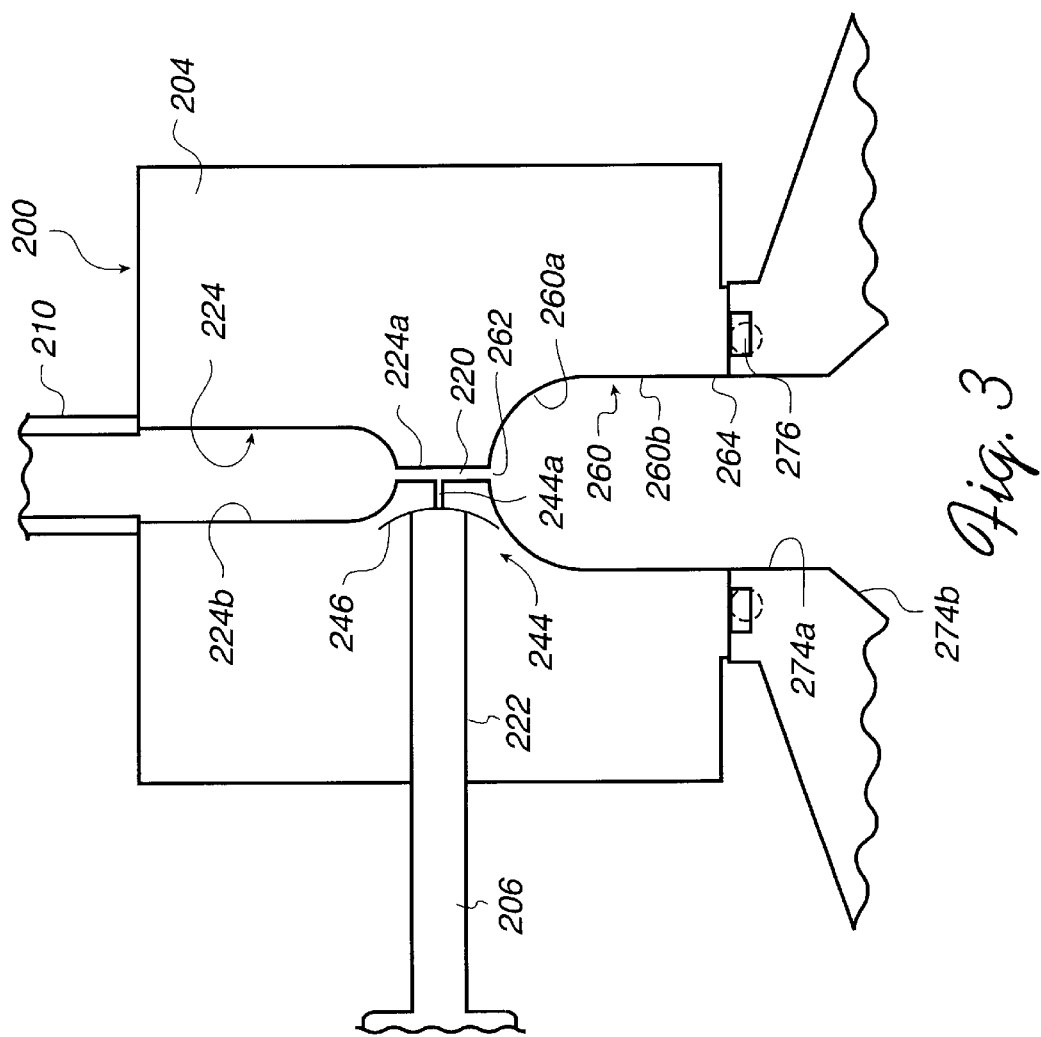
FIG. 3 illustrates an enlarged cross-sectional view of the vaporizer of FIG. 2.

One embodiment of the vaporizer 12 is shown in greater detail in FIGS. 2–4. Referring first to FIG. 2, the vaporizer 12 includes an "atomizer" stage 200 which mixes the liquid precursor 11 with the carrier gas which is then permitted to expand rapidly. As a consequence, the liquid precursor is broken up and dispersed in the carrier gas in tiny particles or droplets which are delivered to a vaporizer chamber 202 to be vaporized. By the term "atomizer," it is not intended to convey that the atomizer stage 200 necessarily disperses the liquid precursor at the atomic level. However, it is believed that the atomizer stage 200 does disperse the liquid precursor into an aerosol-like dispersion in the flow of carrier gas to the vaporizer chamber 202. Aerosol particles can range for example, from $10^{-7}$ to $10^{-4}$ cm ($4 \times 10^{-8}$ to $4 \times 10^{-5}$ in) in diameter; turbulent gases can disperse particles 100 times larger. In one application, it is believed that an atomizer stage in accordance with the illustrated embodiment disperses a Cupraselect® liquid precursor so that most particles of liquid precursor dispersed in the flow of carrier gas to the vaporizer stage 202 have a size substantially smaller than 10 mils (0.010 inches) and more similar to aerosol sized particles. The size of the particles can of course vary, depending upon the application.

The atomizer stage 200 includes a valve body 204 which receives a flow of the liquid precursor through liquid inlet 30, and a flow of carrier gas through gas inlet 36. The liquid inlet 30 includes a coupler 206 which receives one end of a liquid precursor supply line 208 from the liquid flow controller 14 (FIG. 1). The gas inlet 36 includes a coupler 210 which receives one end of a gas supply line 212 from the mass flow controller 38 via a control valve 13. The couplers 206 and 210 may be any of known coupler designs suitable for the particular application. The lines 208 and 212 may be flex lines as described in the aforementioned copending application to facilitate opening and closing the chamber lid 19.

Referring now to FIGS. 3 and 4, the valve body 204 of the atomizer stage 200 includes a fluidic passageway 220 which is coupled by second fluidic passage way 222 to the liquid inlet coupler 206, and a third fluidic passageway 224 to the gas inlet coupler 210. As best seen in FIG. 4, the valve body passageway 220 receives a flow 230 of carrier gas from passageway 224 (FIG. 3) and a flow 232 of liquid precursor from the passageway 222 (FIG. 3) which, in the illustrated embodiment, is arranged orthogonal to the first passageway 220. It is believed that such an arrangement provides a shearing tee intersection 236 which causes the flow 232 of liquid precursor to be "sheared" by the carrier gas flow 230 at the tee intersection 236 and to facilitate mixing with the flow of carrier gas as represented by the combined portions 232a and 230a of the flows 232 and 230, respectively.

In the illustrated embodiment, the mixing passageway 220 has a relatively narrow width as indicated at W in FIG. 4. The narrow width of the passageway 220 is believed to facilitate the formation of relatively small particles or droplets as the flow 232 of liquid precursor is sheared by the flow 230 of carrier gas at the tee intersection 236. In the illustrated embodiment, the mixing passageway has a diameter in the range of 20–30 mils but may be larger or smaller, depending upon the particular application.

The mixing passageway 220 has a pair of inlets 220a and 220b positioned at the tee intersection 236. One inlet 220a is coupled to the passageway 222 to admit liquid precursor from the passageway 222. The other inlet 220b is coupled to the passageway 224 to admit carrier gas from the passageway 224. In the illustrated embodiment, the mixing passageway 220 has a relatively short overall length from the liquid precursor inlet 220a to a cavity inlet 262 as represented by L in FIG. 4. The short length of the mixing passageway 220 relative to the width W of the mixing passageway is believed to inhibit recombination of the particles of the liquid precursor into larger droplets as the mixed flow of carrier gas and liquid precursor flows from the tee intersection 236 to the cavity inlet 262. In the illustrated embodiment, the ratio of the mixing passageway 220 length L to its width W ranges from 2:1 to 20:1. The ratio may vary, depending upon the application.

The inlet 220b of the mixing passageway 220 is coupled to a reduced diameter portion 224a of the carrier gas passageway 224. In the illustrated embodiment, the reduced diameter portion 224a has the same width as the mixing passageway 220.

The rate of flow of carrier gas from the larger diameter portion 224b of the gas passageway 224 to the mixing passageway 220 is accelerated by a constricting nozzle portion 240 (FIG. 3) positioned prior to constricted gas passageway 224a. In the illustrated embodiment, the constricting nozzle portion 240 is hemispherically shaped to smoothly constrict the flow of gas into the reduced diameter passageway 224a and mixing passageway 220. It is believed that the constriction of the gas flow accelerates the gas flow velocity by the "Venturi effect." In the illustrated embodiment, the nozzle portion 240 reduces the diameter of the gas passageway 224 by a factor of approximately ten to one. The nozzle portion 240 prior to the mixing passageway is optional and may have a variety of other shapes including cylindrical and frusto-conical.

In a similar manner, the rate of flow of liquid precursor from the liquid passageway 222 to the mixing passageway 220 is accelerated by a constricting nozzle positioned in the liquid passageway 222 prior to the mixing passageway 220. In the illustrated embodiment, the constricting nozzle is implemented by a "zero dead volume" valve represented schematically at 244 in FIG. 3. Other types of valves may be used also. The valve 244 includes a valve member represented schematically at 246 which when seated again the valve member seat, closes the liquid passageway 222 to prevent the flow of liquid precursor to the mixing passageway 220. In the open position in which the valve member 246 is displaced from the valve seat, the flow of liquid through the valve is constricted in a manner similar to that of the gas flow to accelerate the flow of liquid precursor into the mixing passageway. The constriction of the flow of liquid from the liquid passageway 222, through the open valve 244, to the mixing passageway 220, is represented schematically as reduced diameter valve passageway 244a (FIG. 4) of the passageway 222. In the illustrated embodiment, the passageway 244a has a diameter of approximately 10 mils and the valve 244 in effect reduces the diameter of the liquid passageway 222 by approximately ten to one. The construction details of zero dead volume valves are well known to those skilled in the art and may take a variety of forms. However, it should be appreciated that, in the closed valve position, the volume of any closed passageway of the valve 244 (as represented by "dead leg" passageway 244a) between the mixing passageway 220 and the valve member 246 seated in the valve seat of valve 244, is preferably as small as practical, hence the designation "zero dead volume." Reducing the dead volume of the dead leg of the valve passageways facilitates cleaning and purging the vaporizer 12. In the illustrated embodiment, the volume of the dead leg 244a which is purged when the valve 244 is closed is less than 0.1 cc and is more preferably less than 0.001 cc (cubic centimeters).

The dimensions of the valve may vary depending upon the application. In addition, the valve is optional in some applications.

As best seen in FIG. 3, the mixture of carrier gas and liquid precursor is delivered by the mixing passageway 220 to a cavity 260 formed in the valve body 204. In the illustrated embodiment, the mixing passageway 220 has a relatively constant diameter from the shearing tee 236 to the cavity 260 such that the mixture is delivered to the cavity 260 without substantial additional constriction. To reduce back pressure, it may be desirable in some applications to minimize the length of the reduced diameter passageways. However, it is preferred that the mixing passageway be sufficiently long to centrally direct the mixed flow of carrier gas and liquid precursor to the expansion cavity.

The cavity 260 includes a hemispherically shaped inlet portion 260a followed by a generally cylindrically shaped outlet portion 260b. The hemispherically shaped inlet portion 260a defines the cavity inlet 262 recessed into the cavity wall and fluidically connected to the end of the mixing passageway 220. In the illustrated embodiment, the cavity 260 lacks an injection tip or other inlet member extending into the cavity. At the opposite end of the cavity 260, the cylindrical outlet portion 260b defines a cavity outlet 264 having an inner diameter substantially larger than that of the cavity inlet 262. As shown in FIG. 3, the diameter of the cavity 260 increases monotonically in the hemispherically shaped portion 260a. As a consequence, the mixture of carrier gas and liquid precursor exiting the mixing passageway 220 at the cavity inlet 262, rapidly expands as it passes through the hemispherically shaped inlet portion 260a and is not constricted by the hemispherically shaped inlet portion 260a. It is believed that it is this rapid expansion of the mixture flow which facilitates dispersing the liquid precursor into an aerosol-like flow of very tiny particles borne by the flow of rapidly expanding carrier gas.

In the illustrated embodiment, the inner diameter of the cavity 260 remains substantially constant in the cylindrical outlet portion 260b. The outlet portion 260b is approximately ¼ to ½ in diameter in the illustrated embodimen. The cavity 260 of the atomizer stage may have sizes and shapes other than the hemispherical and cylindrical shapes shown and described. For example, frusto-conical cavities may also be used, depending upon the application. However, constrictions in the cavity may cause an increase in the deposition of materials onto the walls of the cavity.

As best seen in FIG. 2, the vaporizer chamber 202 of the vaporizer 12 includes a housing 270 which defines a generally cylindrical vaporizer chamber interior 272. The aerosol-like dispersion of liquid precursor and carrier gas is delivered by the atomizer outlet 264 to a central inlet 274 defined by the housing 270 of the vaporizer chamber 202. The valve body 204 of the atomizer stage 200 is secured to the housing 270 of the vaporizer chamber 200 with the outlet of the atomizer 200 aligned with the inlet 274 of the vaporizer chamber 202. The coupling between the atomizer 200 and the vaporizer chamber 202 is sealed with suitable seals 276 (FIG. 3).

In the illustrated embodiment, the vaporizer chamber inlet 274 includes a generally cylindrical portion 274a (FIG. 3) having the same inner diameter as the cylindrical portion 260b of atomizer cavity outlet 264, followed by a frusto-conically shaped expanding nozzle portion 274b. Disposed within the chamber interior 272 and facing the vaporizer chamber inlet 274 is a hot plate 280 which is heated to a temperature sufficient to vaporize the particles of liquid precursor borne by the carrier gas to the hot plate 280.

In the illustrated embodiment, the inner diameter of the vaporizer chamber inlet 274 remains substantially constant in the cylindrical portion 274a and expands in a linear monotonic fashion in the frusto-conical portion 274b. The inlet 274 of the vaporizer chamber 202 may have shapes other than the cylindrical and frusto-conical shapes shown and described. For example, hemispherically shaped inlets may also be used, depending upon the application. However, constrictions in the inlet may cause an increase in the deposition of materials onto the walls of the inlet.

Figure 5:
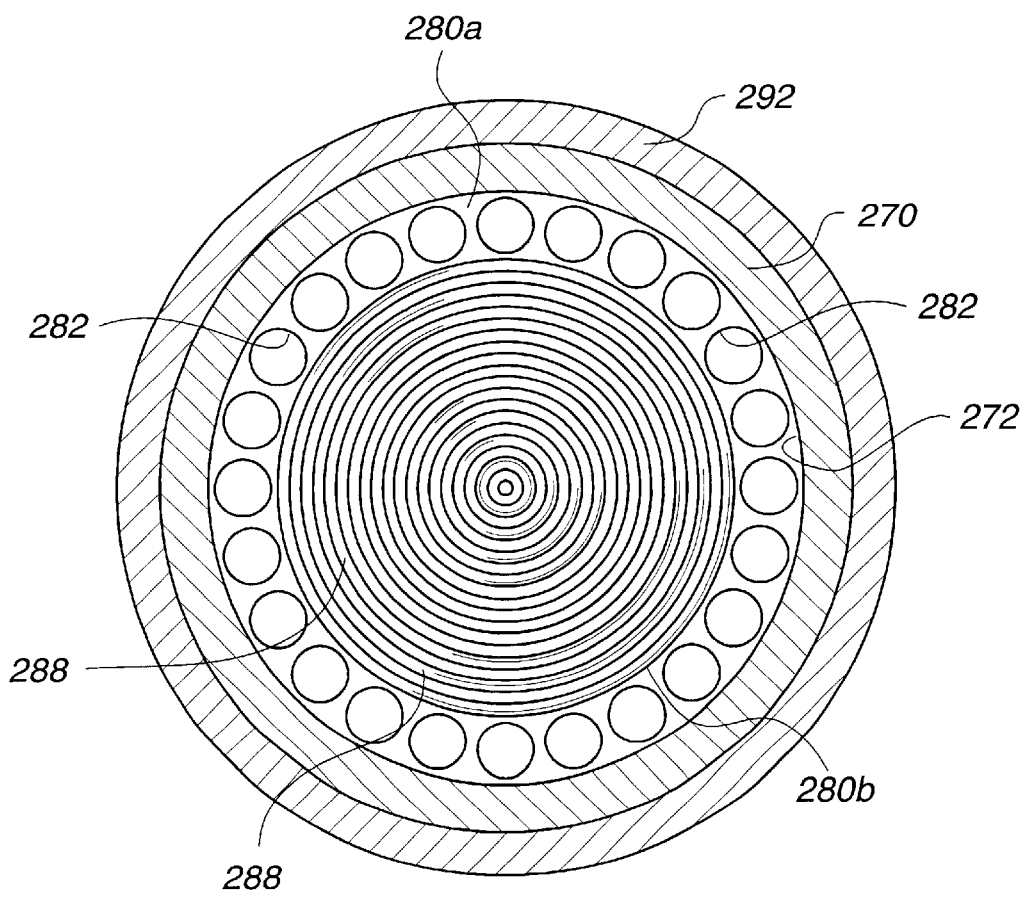
FIG. 5 illustrates a top view of the hot plate of the vaporizer of FIG. 2 as viewed along the lines 5—5 of FIG. 2.

As best seen in FIG. 5, the hot plate 280 is disposed within the vaporizer chamber interior 272 and has an annular-shaped outer zone 280a which defines a plurality of passageways 282 disposed around the outer zone 280a. Each hot plate passageway 282 passes through the hot plate 280 to permit vaporized material to pass through the hot plate 280 and through an opening 284 (FIG. 2) in the lid 19 of the processing chamber 18 to the interior 286 of the processing chamber 18. The size and number of the passageways 282 may vary, depending upon the application. In the illustrated embodiment, it is preferred for the passageways to be of a sufficiently large size and number so as to reduce or eliminate any substantial pressure drop as the vapor passes through the hot plate.

A line of sight as indicated by the line 290 (FIG. 2) along the sides of the frusto-conical portion 274b intersects a central disk-shaped zone 280b on the upper surface of the hot plate 280. As a consequence, the sides of the frusto-conical portion 274b of the vaporizer chamber inlet 274 direct a majority of the dispersed liquid precursor material onto the central zone 280b of the hot plate 280 to be vaporized. Other angles may be selected, depending upon the application.

As shown in FIGS. 2 and 5, the central zone 280b of the hot plate 280 has a plurality of concentric grooves 288 which receive droplets of liquid precursor from the atomizer stage 200 and vaporize the droplets into a vapor. The grooves increase the effective surface of the hot plate for transferring heat energy to the droplets to vaporize the droplets. In addition, the grooves collect droplets which do not immediately vaporize until the droplets receive sufficient energy to vaporize. The vaporized material passes through the passages 282 of the hot plate and through the lid opening 284 to the interior of the deposition chamber 18 as indicated by the flow arrow 289.

In the illustrated embodiment, the grooves 288 of the hot plate 280 have a width in the range of ¹⁄₁₆ to ⅛ inch and a depth in the range of ¼ to ½ inch. The dimensions may vary, depending upon the application. It is preferred that the grooves be sized to maintain good heat conduction to inhibit excessive cooling of the hot plate top surface. In addition, the size of the grooves can affect fabrication cost and cleaning efficiency.

The vaporizer 12 including the valve body 204, chamber housing 270, and the hot plate 280, is heated by a heating jacket 292 which encloses the exterior of the vaporizer chamber housing 270 and the exterior of the hot plate outer zone 280a. The components of the vaporizer 12 in the illustrated embodiment including the valve body 204, vaporizer chamber housing 270, and hot plate 280 are fabricated from.aluminum. It should be appreciated that other materials may be used including other high heat conductive materials. The temperature of the components of the atomizer stage 200 and the vaporizer chamber including the hot plate 280 which may come into contact with the liquid precursor or vapor are controlled in the illustrated embodiment. The temperatures are preferably sufficiently high to facilitate vaporization of the liquid precursor and sufficiently low to avoid degradation of the chemicals. In the illustrated embodiment in which the liquid precursor is Cupraselect®, a temperature range for these components of 70–75° C. is preferred. The temperature range may of course vary, depending upon the application. Alternative to the heating jacket, the heating may accomplished by any known and accepted means for chamber component heating such as, but not limited to, fluid exchange with fluid remotely heated, resistive heating elements contained in or upon the hot plate 280, chamber housing 270 or valve body 204, and heat lamps (not shown) within the chamber or the like. If the hot plate is heated by heat applied to or in the outer zone 280a of the hot plate, it is preferred that the hot plate passageways 282 leave sufficient material of the outer zone 280a between adjacent passageways to permit heat to be adequately conducted to the interior hot plate zone 280b.

The vaporizer chamber housing 270 is mounted on the hot plate outer zone 280b which in turn is mounted on the deposition chamber lid 19 aligned with the opening 284 in the lid 19. The coupling between the vaporizer hot plate 280 and the deposition chamber lid 19 is sealed with suitable seals 300 (FIG. 2) as is the coupling between the vaporizer housing 270 and the hot plate 280. The deposition chamber 18 is defined by sidewalls 302, floor 304 and lid 19. The lid 19 incorporates a showerhead 308 having a plurality of orifices 310 therein to distribute the vapor for deposition. The deposition chamber 18 further contains a heated susceptor 312 for retaining a substrate 316 such as a semiconductor wafer onto which it is desirable to deposit copper. The susceptor 312 is fabricated from a durable metallic material such as aluminum or a ceramic such as aluminum nitride or boron nitride. The susceptor 312 also functions as a heater or heat sink and contains additional components to heat or draw heat from the wafer 316. For example, the susceptor 312 can be provided with one or more resistive heater coils 313 which are connected to a power source. The power source provides a current flow through the coil 313 which generates heat within the substrate support 312 which is then conducted to the wafer 316. An annular plate 314 circumscribes the chamber walls 302 and provides support for a cover ring 318. Copper is deposited onto the substrate 316 by CVD when a vaporized precursor from the vaporizer 12 contacts the heated wafer. Cover ring 318 provides protection to peripheral portions of the substrate 316 and lower chamber regions upon which deposition is undesirable. A pressure control unit 342, (e.g., a vacuum pump), is coupled to the process chamber 18 via a valve 338 (e.g., a throttle valve) to control the chamber pressure.

The showerhead of the deposition chamber is optional and may be any of known conventional showerheads. In addition the showerhead may be constructed as described in the aforementioned copending application. As described therein, the showerhead 308 is fabricated to serve not only as a distribution plate for the vaporized precursor and carrier materials, but also as a secondary "hot plate" to catch and revaporize excess process material. The showerhead 308 performs this function by way of a plurality of optional concave segments 326 formed on an upper surface of the showerhead 308 and an optional shadow plate 324 disposed above the showerhead 308. A flow of completely vaporized process material 289 passes from the vaporizer 12 and into the chamber 18. A flow 343 continues through a plurality of orifices 344 provided in the shadow plate 324 and through the plurality of orifices 310 in the showerhead 308. The shadow plate orifices 344 are offset from the showerhead orifices 310 to reduce liquid precursor contamination. Specifically, a flow 345 of an incompletely vaporized (liquid) material from the vaporizer 12 is caught by one of the concave portions 326 on the top of the showerhead 308. The showerhead 308 and shadow plate 324 are heated to approximately 65° C. which is a temperature suitable for vaporization of the liquid precursor material (i.e., Cupraselect®). The heating is accomplished by any known and accepted means for chamber component heating such as, but not limited to, fluid exchange with fluid remotely heated, resistive heating elements contained in or upon the showerhead 308 and/or shadow plate 324, heat lamps within the chamber 18 or the like. As such, the liquid material vaporizes and follows a path 347 through one of the plurality of orifices 310 in the showerhead 308. The flow of incompletely vaporized material can also occur along path 350, become vaporized on the shadow plate 324 and continue as a vaporized flow along path 352. It is believed that the showerhead 308 and shadow plate 324 prevent the flow of liquid material to the wafer surface by capturing and secondarily vaporizing such liquid.

Various components described above such as the hot plate 280, the housing 270 or the valve body 200 may each be fabricated as monolithic or one-piece structures. Alternatively, these components may be assembled from subcomponents, depending upon the particular application.

The above-described apparatus and process can be performed in a system that is controlled by a processor based control system 17 (FIG. 1). FIG. 8 shows a block diagram of a deposition system 10, such as that depicted in FIG. 1, having such a control system 17 that can be employed in such a capacity. The control system 17 includes a processor unit 802, a memory 804, a mass storage device 806, an input control unit 808, and a display unit 810 which are all coupled to a control system bus 812.

The processor unit 802 forms a general purpose computer that becomes a specific purpose computer when executing programs such as a program for implementing the CVD of copper of the illustrated embodiment. Although this embodiment is described herein as being implemented in software and executed upon a general purpose computer, those skilled in the art will realize that the present invention could be operated using hardware such as an application specific integrated circuit ASIC or other hardware circuitry. As such, the control aspects of the embodiments of the present inventions should be understood as being able to be implemented, in whole or in part, in software, hardware or both.

The processor unit 802 is either a microprocessor or other engine that is capable of executing instructions stored in a memory. The memory 804 can be comprised of a hard disk drive, random access memory ("RAM"), read only memory ("ROM"), a combination of RAM and ROM, or another processor readable storage medium. The memory 804 contains instructions that the processor unit 802 executes to facilitate the performance of the deposition system 10. The instructions in the memory 804 are in the form of program code. The program code may conform to any one of a number of different programming languages. For example, the program code can be written in C+, C++, BASIC, Pascal, or a number of other languages.

The mass storage device 806 stores data and instructions and retrieves data and program code instructions from a processor readable storage medium, such as a magnetic disk or magnetic tape. For example, the mass storage device 806 can be a hard disk drive, floppy disk drive, tape drive, or optical disk drive. The mass storage device 806 stores and retrieves the instructions in response to directions that it receives from the processor unit 802. Data and program code instructions that are stored and retrieved by the mass storage device 806 are employed by the processor unit 802 for operating the deposition system 90. The data and program code instructions are first retrieved by the mass storage device 806 from a medium and then transferred to the memory 804 for use by the processor unit 802.

The display unit 810 provides information to a chamber operator in the form of graphical displays and alphanumeric characters under control of the processor unit 802. The input control unit 808 couples a data input device, such as a keyboard, mouse, or light pen, to the processor unit 802 to provide for the receipt of a chamber operator's inputs.

The control system bus 812 provides for the transfer of data and control signals between all of the devices that are coupled to the control system bus 812. Although the control system bus is displayed as a single bus that directly connects the devices in the processor unit 802, the control system bus 812 can also be a collection of busses. For example, the display unit 810, input control unit 808 and mass storage device 806 can be coupled to an input-output peripheral bus, while the processor unit 802 and memory 804 are coupled to a local processor bus. The local processor bus and input-output peripheral bus are coupled together to form the control system bus 812.

The control system 17 is coupled to the elements of the deposition system 10, employed in copper CVD in accordance with the illustrated embodiment. Each of these elements is coupled to the control system bus 812 to facilitate communication between the control system 17 and the elements. These elements include the following: a plurality of valves 814 (such as valves 13 and 15 of FIG. 1), the heating elements (such as the heating element 113 and heating jacket 292 of FIG. 2), the pressure control unit 342, the flow controllers (such as the flow controllers 14 and 38 of FIG. 1), vaporizer 12 (including the valve 244 of FIG. 3), and a pressure source controller (such as pressure source 24 of FIG. 1). The control system 17 provides signals to the chamber elements that cause these elements to perform operations for forming a layer of copper in the subject apparatus.

In operation, the processor unit 802 directs the operation of the chamber elements in response to the program code instructions that it retrieves from the memory 804. For example, once a wafer is placed in the processing chamber 100, the processor unit 802 executes instructions retrieved from the memory 804 such as activating the heating element 313, controlling valves 814 to produce the desired flow rate of precursor and carrier materials, move susceptor 312 into position for CVD and the like. The execution of these instructions results in the elements of the deposition system 10 being operated to deposit a layer of material on a substrate.

The novel deposition system described above may provide for an improved CVD operation by more completely and uniformly dispersing and vaporizing a precursor material in a chamber. Additionally, various features of the deposition system may include a reduction in the likelihood of clogging or excessive and undesirable plating that potentially creates particles in the chamber and/or premature failure or excessive maintenance of system components.

It should be understood that the preceding is merely a description of some embodiments of the present inventions and that numerous changes to the disclosed embodiments can be made in accordance with the disclosure herein without departing from the spirit or scope of the inventions. The preceding description, therefore is not meant to limit the scope of the inventions. Rather, the scope of the inventions are to be determined only by the appended claims and their equivalents.

What is claimed is:

1. Apparatus for use with a source of carrier gas and a source of liquid precursor for performing chemical vapor deposition, comprising:
    a deposition chamber having a lid; and
    a vaporizer carried by said lid, said vaporizer comprising a body defining a cavity having an outlet and an inlet wherein said outlet is larger than said inlet, said body further defining a first passageway coupled to said inlet and having a width W and a length L and adapted to carry a mixed flow of carrier gas and a liquid precursor to said cavity inlet, wherein the ratio of said length L to said width W of said first passageway to said cavity inlet does not exceed 20:1, wherein said liquid precursor is dispersed by said carrier gas expanding through said cavity and wherein said first passageway has a carrier gas inlet and a liquid precursor inlet spaced from said cavity inlet by said first passageway length L, and wherein said body further comprises a second passageway adapted to carry a flow of liquid precursor and coupled to said first passageway liquid precursor inlet, and a third passageway coupled to said first passageway carrier gas inlet and adapted to carry a flow of carrier gas to said first passageway, said first passageway being shaped so as to direct a flow of carrier gas past said liquid precursor inlet so that the flow of carrier gas shears said flow of liquid precursor into droplets of liquid precursor to form a mixed flow of both said liquid precursor droplets and said carrier gas wherein said first passageway carries said mixed flow of both said liquid precursor droplets and said carrier gas over said length L to said cavity inlet and wherein said cavity has a flow cross-sectional area which increases monotonically from said inlet to said outlet.

2. The apparatus of claim 1 wherein said cavity is nozzle shaped.

3. Apparatus for use with a source of carrier gas and a source of liquid precursor for performing chemical vapor deposition, comprising:
    a deposition chamber having a lid; and
    a vaporizer carried by said lid, said vaporizer comprising a body defining a cavity having an outlet and an inlet wherein said outlet is larger than said inlet, said body further defining a first passageway coupled to said inlet and having a width W and a length L and adapted to carry a mixed flow of carrier gas and a liquid precursor to said cavity inlet, wherein the ratio of said length L to said width W of said first passageway to said cavity inlet does not exceed 20:1, wherein said liquid precursor is dispersed by said carrier gas expanding through said cavity and wherein said first passageway has a carrier gas inlet and a liquid precursor inlet spaced from said cavity inlet by said first passageway length L, and wherein said body further comprises a second passageway adapted to carry a flow of liquid precursor and coupled to said first passageway liquid precursor inlet, and a third passageway coupled to said first passageway carrier gas inlet and adapted to carry a flow of carrier gas to said first passageway, said first passageway being shaped so as to direct a flow of carrier gas past said liquid precursor inlet so that the flow of carrier gas shears said flow of liquid precursor into droplets of liquid precursor to form a mixed flow of both said liquid precursor droplets and said carrier gas wherein said first passageway carries said mixed flow of both said liquid precursor droplets and said carrier gas over said length L to said cavity inlet and wherein said body has a hemispherically shaped wall positioned to define a hemispherically shaped portion of said cavity.

4. Apparatus for use with a source of carrier gas and a source of liquid precursor for performing chemical vapor deposition, comprising:
    a deposition chamber having a lid; and
    a vaporizer carried by said lid, said vaporizer comprising a body defining a cavity having an outlet and an inlet wherein said outlet is larger than said inlet, said body further defining a first passageway coupled to said inlet and having a width W and a length L and adapted to carry a mixed flow of carrier gas and a liquid precursor to said cavity inlet, wherein the ratio of said length L to said width W of said first passageway to said cavity inlet does not exceed 20:1, wherein said liquid precursor is dispersed by said carrier gas expanding through said cavity and wherein said first passageway has a carrier gas inlet and a liquid precursor inlet spaced from said cavity inlet by said first passageway length L, and wherein said body further comprises a second passageway adapted to carry a flow of liquid precursor and coupled to said first passageway liquid precursor inlet, and a third passageway coupled to said first passageway carrier gas inlet and adapted to carry a flow of carrier gas to said first passageway, said first passageway being shaped so as to direct a flow of carrier gas past said liquid precursor inlet so that the flow of carrier gas shears said flow of liquid precursor into droplets of liquid precursor to form a mixed flow of both said liquid precursor droplets and said carrier gas wherein said first passageway carries said mixed flow of both said liquid precursor droplets and said carrier gas over said length L to said cavity inlet and wherein said body has a frusto-conically shaped wall positioned to define a frusto-conically shaped portion of said cavity.

5. A vaporizer for use with a source of carrier gas, a source of liquid precursor and a deposition chamber for performing chemical vapor deposition, comprising:

a body defining a cavity having an outlet and an inlet, said body further defining a first passageway coupled to said cavity inlet and adapted to carry a flow of carrier gas and a liquid precursor to said cavity inlet, said first passageway having a liquid precursor inlet, and defining a width W and a length L between said liquid precursor inlet and said cavity inlet, said body further defining a second passageway coupled to said first passageway liquid precursor inlet and adapted to carry a flow of liquid precursor to said first passageway, and a third passageway coupled to said first passageway and adapted to carry a flow of carrier gas to said first passageway, said first passageway being shaped so as to direct a flow of carrier gas past said liquid precursor inlet so that the flow of carrier gas shears said flow of liquid precursor into droplets of liquid precursor to form a mixed flow of both said liquid precursor droplets and said carrier gas between said liquid precursor inlet and said cavity inlet and the ratio of said length L to said width W of said first passageway between said liquid precursor inlet and said cavity inlet does not exceed 20:1, and wherein said cavity is shaped to permit said carrier gas to expand through said cavity to disperse said liquid precursor droplets and wherein said second passageway is coupled to said first passage way at an angle so that the flow of carrier gas from said third passageway through said first passageway mixes said flow of liquid precursor from said second passageway with said carrier gas flowing in said first passageway.

6. An apparatus for use with a source of carrier gas and a source of liquid precursor for performing chemical vapor deposition, comprising:

a deposition chamber having a lid; and a vaporizer carried by said lid, said vaporizer comprising an aluminum body defining a nozzle-shaped cavity having an outlet and a recessed inlet wherein said outlet is larger than said inlet and said cavity outlet has a width in excess of ¼ inch, said body further defining a first passageway coupled to said inlet and having a width W and a length L and adapted to carry a mixed flow of carrier gas and a liquid precursor to said cavity inlet, wherein the length L of said first passageway is less than 100 mils and the width W of said first passageway is less than 30 mils and the ratio of said length L to said width W of said first passageway to said cavity inlet is within a range of 2:1 to 20:1 and wherein said first passageway has a carrier gas inlet and a liquid precursor inlet spaced from said cavity inlet by said first passageway length L, and wherein said body further comprises a second passage way adapted to carry a flow of liquid precursor and coupled to said first passageway liquid precursor inlet, and a third passageway coupled to said first passageway carrier gas inlet and adapted to carry a flow of carrier gas to said first passageway, said first passageway being shaped so as to direct a flow of carrier gas past said liquid precursor inlet so that the flow of carrier gas shears said flow of liquid precursor into droplets of liquid precursor to form a mixed flow of both said liquid precursor droplets and said carrier gas wherein said first passageway carries said mixed flow of both said liquid precursor droplets and said carrier gas over said length L to said cavity inlet; wherein said liquid precursor droplets are dispersed by said carrier gas expanding through said cavity, said vaporizer further comprising a valve disposed in said second passageway, said valve having respective open and closed positions and being adapted to permit a flow of liquid precursor through said second passageway to said first passageway when in said open position, wherein said second passageway defines a dead leg portion between said valve and said first passageway when said valve is in said closed position and wherein said dead leg portion has a volume of 0.1 cc or less;

wherein said chamber has a showerhead adapted to distribute vaporized material, and wherein said vaporizer further has an aluminum hot plate disposed between said showerhead and said cavity outlet and adapted to vaporize dispersed liquid precursor droplets into vaporized material prior to distribution by said showerhead, wherein said hot plate has a surface facing said cavity outlet and defines a plurality of concentric grooves.

* * * * *